(12) United States Patent
Takada et al.

(10) Patent No.: US 12,510,820 B2
(45) Date of Patent: Dec. 30, 2025

(54) PELLICLE MEMBRANE, PELLICLE, MEMBRANE, GRAPHENE SHEET, AND METHOD FOR PRODUCING THE GRAPHENE SHEET

(71) Applicant: TOPPAN INC., Tokyo (JP)

(72) Inventors: Naoya Takada, Tokyo (JP); Kazunori Seki, Tokyo (JP); Yutaka Kodera, Tokyo (JP)

(73) Assignee: TOPPAN INC., Tokyo (JP)

( * ) Notice: Subject to any disclaimer, the term of this patent is extended or adjusted under 35 U.S.C. 154(b) by 641 days.

(21) Appl. No.: 17/894,329

(22) Filed: Aug. 24, 2022

(65) Prior Publication Data

US 2022/0413379 A1    Dec. 29, 2022

Related U.S. Application Data

(63) Continuation of application No. PCT/JP2021/006852, filed on Feb. 24, 2021.

(30) Foreign Application Priority Data

Feb. 27, 2020   (JP) ................................ 2020-031985

(51) Int. Cl.
*G03F 1/64*    (2012.01)
*B32B 3/26*    (2006.01)
(Continued)

(52) U.S. Cl.
CPC ................ *G03F 1/64* (2013.01); *B32B 3/266* (2013.01); *B32B 9/007* (2013.01); *B32B 9/04* (2013.01); *C01B 32/05* (2017.08); *C01B 2204/02* (2013.01); *C01B 2204/04* (2013.01); *C01B 2204/26* (2013.01)

(58) Field of Classification Search
CPC ........... G03F 1/62; G03F 1/64; G03F 7/70983
See application file for complete search history.

(56) References Cited

U.S. PATENT DOCUMENTS

| 2013/0088699 A1 | 4/2013 | Yakunin et al. |
| 2014/0160455 A1 | 6/2014 | Yakunin et al. |

(Continued)

FOREIGN PATENT DOCUMENTS

| JP | 2018-194838 A | 12/2018 |
| JP | 2018-194840 A | 12/2018 |

(Continued)

OTHER PUBLICATIONS

Partial Supplementary European Search Report issued in connection with EP Appl. Ser. No. 21760686.2 dated Jul. 12, 2023.
(Continued)

*Primary Examiner* — Stewart A Fraser
(74) *Attorney, Agent, or Firm* — Foley & Lardner LLP (57) ABSTRACT

A technique that enables production of pellicle membranes that are better resistant to breakage when subjected to force exerted thereon in the thickness direction thereof and that have high transmittance to light. A pellicle membrane of the present invention includes a plurality of laminated layers, where at least one of the layers is provided with at least one hole having a width or diameter of 10 nm to 500 nm.

11 Claims, 11 Drawing Sheets

(51) Int. Cl.
*B32B 9/00* (2006.01)
*B32B 9/04* (2006.01)
*C01B 32/05* (2017.01)

(56) References Cited

U.S. PATENT DOCUMENTS

| | | |
|---|---|---|
| 2017/0017150 A1 | 1/2017 | Yakunin et al. |
| 2017/0038675 A1* | 2/2017 | Ahn .................... G03F 1/62 |
| 2017/0145562 A1 | 5/2017 | Farquhar et al. |
| 2017/0296979 A1 | 10/2017 | Swett et al. |
| 2018/0259846 A1 | 9/2018 | Yakunin et al. |
| 2018/0364561 A1 | 12/2018 | Vles et al. |
| 2018/0373140 A1* | 12/2018 | Yanase ................. G03F 1/64 |
| 2019/0121229 A1* | 4/2019 | Okubo .................. G03F 7/20 |
| 2019/0137865 A1* | 5/2019 | Lin ....................... G03F 1/22 |
| 2019/0168485 A1 | 6/2019 | Height et al. |
| 2020/0064731 A1 | 2/2020 | Vles et al. |
| 2021/0208500 A1 | 7/2021 | Vles et al. |
| 2022/0252974 A1 | 8/2022 | Vles et al. |

FOREIGN PATENT DOCUMENTS

| | | |
|---|---|---|
| JP | 2018-536617 A | 12/2018 |
| JP | 2018-537720 A | 12/2018 |
| JP | 2019-520296 A | 7/2019 |
| WO | WO-2011/160861 A1 | 12/2011 |
| WO | WO-2018/008594 A1 | 1/2018 |
| WO | WO-2018/111433 A1 | 6/2018 |
| WO | WO-2020/008978 A1 | 1/2020 |

OTHER PUBLICATIONS

Office Action issued in corresponding Japanese Patent Application No. 2020-031985 dated Jan. 23, 2024 (9 pages).

International Searching Authority, "International Search Report," issued in connection with International Patent Application No. PCT/JP2021/006852, dated May 18, 2021.

International Searching Authority, "Written Opinion," issued in connection with International Patent Application No. PCT/JP2021/006852, dated May 18, 2021.

* cited by examiner

PELLICLE MEMBRANE, PELLICLE, MEMBRANE, GRAPHENE SHEET, AND METHOD FOR PRODUCING THE GRAPHENE SHEET

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2021/006852, filed on Feb. 24, 2021, which in turn claims the benefit of JP 2020-031985, filed Feb. 27, 2020 the disclosures of all which are incorporated herein by reference in its entirety.

TECHNICAL FIELD

The present invention relates to pellicles.

BACKGROUND

The minimum dimensions of a pattern that can be formed by photolithography depend on the wavelength of light used for exposure. Such minimum dimensions can be reduced when light with shorter wavelengths is used for exposure.

An ArF excimer laser operating at a wavelength of 193 nm has traditionally been used for exposure. Recent years have seen growing demands for a photolithography technology that enables the formation of finer patterns, resulting in the increasing use of extreme ultraviolet radiation (EUV light) having a wavelength of 13.5 nm.

Pellicles are used for the purpose of preventing adhesion of dust or the like to photomasks or reticles. Due to the fact that EUV light is easily absorbed by various materials, for extreme ultraviolet lithography (EUVL), pellicle membranes are being developed that are produced using polysilicon, which exhibits low absorbance to EUV light.

Films of carbon material such as graphene or carbon nanotube have superior heat resistance to films of polysilicon. For this reason, attention has been paid to pellicle membranes of carbon material such as graphene or carbon nanotube (see PTL 1 to 3).

[Citation List] [Patent Literature] PTL 1: JP 2018-194838 A; PTL 2:JP 2018-194840 A; PTL 3: WO 2018/008594.

SUMMARY OF THE INVENTION

The present invention aims to provide a technique that enables production of pellicle membranes that are better resistant to breakage when subjected to force exerted thereon in the thickness direction thereof and that have high transmittance to light.

A first aspect of the present invention provides a pellicle membrane including a plurality of laminated layers, the laminated layers including at least a first layer and a second layer, where at least the first layer has at least one hole, the at least one hole having a width or diameter of 10 nm to 500 nm.

A second aspect of the present invention provides a pellicle membrane including a plurality of laminated layers, the laminated layers including at least a first layer and a second layer, where each of at least the first and second layers has at least one hole.

Another aspect of the present invention provides the pellicle membrane according to the first or second aspect, where the plurality of laminated layers are each comprised of a material selected from graphene, carbon nanotube, polysilicon, and silicon nitride.

Another aspect of the present invention provides the pellicle membrane according to the first or second aspect, where the plurality of laminated layers are each comprised of one or more materials that include one or more metal elements selected from zirconium, niobium, molybdenum, tantalum, hafnium, scandium, titanium, vanadium, and chromium.

A third aspect of the present invention provides a pellicle membrane including a plurality of laminated layers, the laminated layers including at least a first layer and a second layer, where the laminated layers are each comprised of a material selected from graphene and carbon nanotube, and at least the first layer has at least one hole.

Still another aspect of the present invention provides the pellicle membrane according to any one of the above aspects, where the at least one hole has a width or diameter of 500 nm or less.

Still another aspect of the present invention provides the pellicle membrane according to any one of the above aspects, where the at least one hole of at least the first layer comprises a plurality of holes, the plurality of holes being regularly arranged.

Still another aspect of the present invention provides the pellicle membrane according to any one of the above aspects, where the at least one hole of at least the first layer comprises a plurality of holes, the plurality of holes being identical in shape to each other.

Still another aspect of the present invention provides the pellicle membrane according to any one of the above aspects, where the first and second layers are arranged adjacent to each other; the first layer includes, as the at least one hole of the first layer, at least a first hole disposed at a first position in the first layer; the second layer includes, as the at least one hole of the second layer, at least a second hole disposed at a second position in the second layer; and the first position of the at least one first hole is different from the second portion of the at least one second hole.

Still another aspect of the present invention provides the pellicle membrane according to any one of the above aspects, where the laminated layers include at least one hole-free layer provided with no holes.

Still another aspect of the present invention provides the pellicle membrane according to the previous aspect, where the laminated layers include a first outermost layer and a second outermost layer, and the at least one hole-free layer includes at least one of the first outermost layer and the second outermost layer.

Still another aspect of the present invention provides the pellicle membrane according to any one of the above aspects, where the plurality of laminated layers are each comprised of a graphene sheet.

A fourth aspect of the present invention provides a pellicle membrane including a plurality of laminated graphene sheets, each of the graphene sheets having a true density and an apparent density, the apparent density being less than the true density.

A fifth aspect of the present invention provides a pellicle membrane including a laminate including a plurality of laminated graphene sheets, the laminate having a first thickness and a first level of transmittance, the first thickness of the laminate being equal to a second thickness of a reference laminate, the first level of transmittance being higher than a second level of light transmittance of the reference laminate, the reference laminate including a plurality of laminated graphene continuous-membrane sheets.

Still another aspect of the present invention provides the pellicle membrane according to any one of the above aspects, where the pellicle membrane has a thickness of 200 nm or less.

A sixth aspect of the present invention provides a pellicle including the pellicle membrane according to any one of the above aspects and a frame supporting the pellicle membrane.

A seventh aspect of the present invention provides a membrane including a plurality of laminated graphene sheets, the laminated graphene sheets including a first graphene sheet and a second graphene sheet, where at least the first graphene sheet has at least one hole.

Still another aspect of the present invention provides the membrane according to the seventh aspect, where the at least one hole has a width or diameter of 500 nm or less.

Still another aspect of the present invention provides the membrane according to the seventh or previous aspect, where the first and second graphene sheets are arranged adjacent to each other; the first graphene sheet includes, as the at least one hole of the first graphene sheet, at least a first hole disposed at a first position in the first graphene sheet; the second graphene sheet includes, as the at least one hole of the second graphene sheet, at least a second hole disposed at a second position in the second graphene sheet; and the first position of the at least one first hole is different from the second position of the at least one second hole.

Still another aspect of the present invention provides the membrane according to any one of the previous three aspects, where the laminated graphene sheets include at least one hole-free sheet provided with no holes.

Still another aspect of the membrane according to the previous aspect, where the laminated graphene sheets include a first outermost sheet and a second outermost sheet, and the at least one hole-free sheet includes at least one of the first outermost sheet and the second outermost sheet.

An eighth aspect of the present invention provides a membrane including a plurality of laminated graphene sheets, each of the graphene sheets having a true density and an apparent density, the apparent density being less than the true density.

A ninth aspect of the present invention provides a membrane including a laminate including a plurality of laminated graphene sheets, the laminate having a first thickness and a first level of transmittance, the first thickness of the laminate being equal to a second thickness of a reference laminate, the first level of transmittance being higher than a second level of transmittance of the reference laminate, the reference laminate including a plurality of laminated graphene continuous-membrane sheets.

A tenth aspect of the present invention provides a graphene sheet including at least one hole.

An eleventh aspect of the present invention provides a method for producing a graphene sheet, including forming at least one mask layer on a metal layer such that the at least one mask layer partially covers the metal layer; and producing graphene on a portion of the metal layer not covered by the mask layer.

A twelfth aspect of the present invention provides a method for producing a graphene sheet, including producing graphene on a metal layer having at least one hole.

DETAILED DESCRIPTION

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

The embodiments of the present invention are a group of embodiments based on a single unique invention. The aspects of the present invention are those of the group of embodiments based on a single invention. Configurations of the present invention can have aspects of the present disclosure. Features of the present invention can be combined to form the configurations. Therefore, the features of the present invention, the configurations of the present invention, the aspects of the present disclosure, and the embodiments of the present invention can be combined, and the combinations can have a synergistic function and exhibit a synergistic effect.

Figure 1:
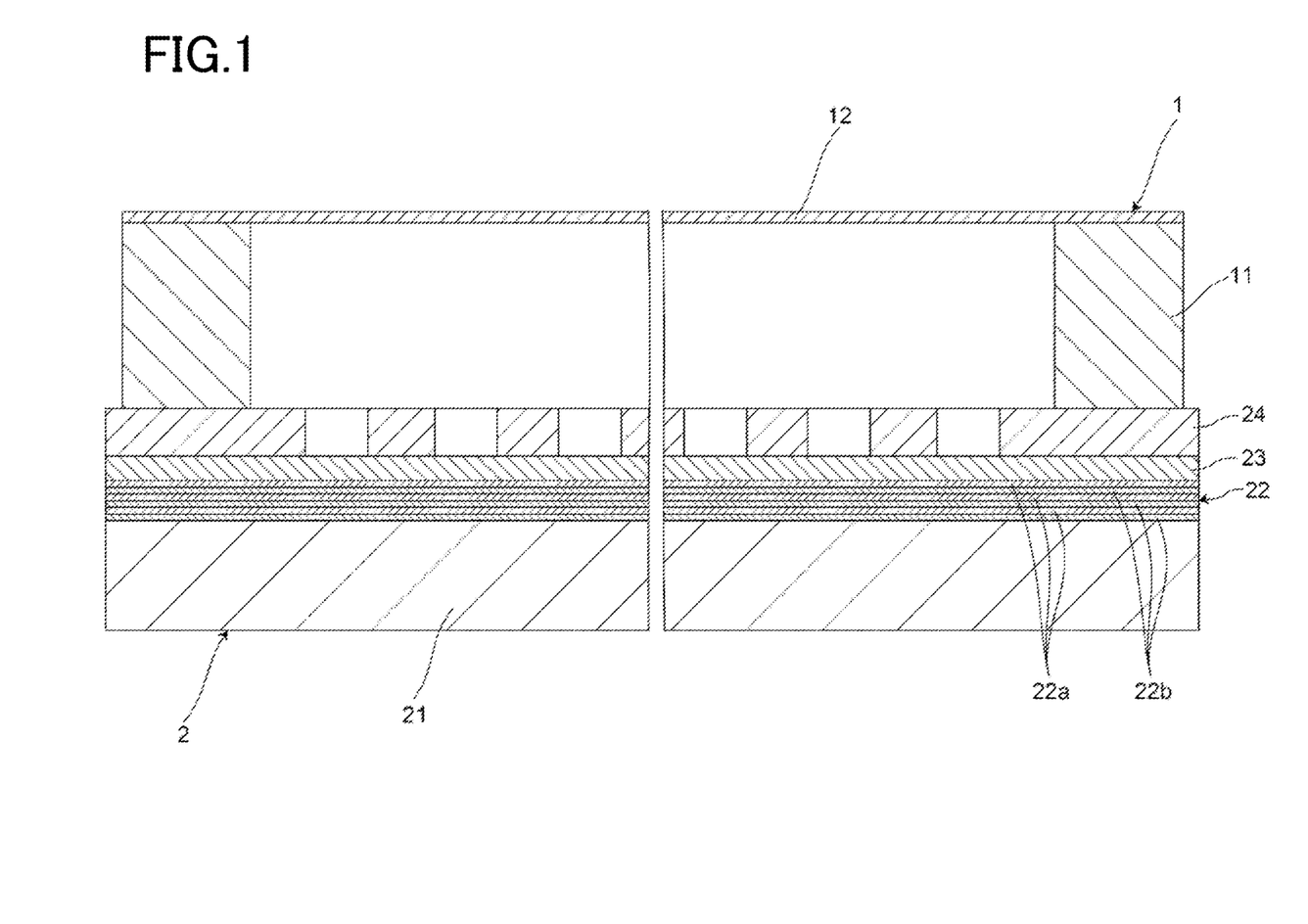
FIG. 1 is a schematic cross-sectional view of a pellicle according to an embodiment of the present invention, attached to a photomask.

FIG. 1 is a schematic cross-sectional view of a pellicle according to an embodiment of the present invention, attached to a photomask.

FIG. 1 illustrates a pellicle 1 attached to a photomask 2. The photomask 2 is a reflective photomask used for EUV lithography. The pellicle 1 may be attached to another type of photomask.

The photomask 2 includes a substrate 21, a multilayered reflective film 22, a capping film 23, and an absorption layer 24.

The substrate 21 has a flat surface. The substrate 21 may be made of a material having a low coefficient of thermal expansion, such as synthetic silica.

The multilayered reflective film 22 is disposed on the above surface of the substrate 21. The multilayered reflective film 22 includes two or more layers having different refractive indexes for EUV light. The multilayered reflective film 22 is designed to have a high reflectance to EUV light and to have a low reflectance to other light, due to multiple-beam interference.

Here, the multilayered reflective film 22 includes alternately laminated reflective layers 22a and 22b having different refractive indexes for EUV light. For example, one of the reflective layer 22a and the reflective layer 22b may be composed of silicon, and the other thereof may be composed of molybdenum. Although FIG. 1 illustrates a multilayered reflective film 22 including three sets of reflective layers 22a and 22b, the multilayered reflective film 22 typically includes more sets (e.g., about 40 sets) of reflective layers 22a and 22b.

The capping film 23 is disposed on the multilayered reflective film 22. The capping film 23 serves to protect the multilayered reflective film 22 from an etching solution or a cleaning agent during patterning for obtaining the absorption layer 24 or cleaning of the photomask 2. The capping film 23 may be composed of ruthenium, for example.

The absorption layer 24 is disposed on the capping film 23. The absorption layer 24 has holes arranged in a pattern corresponding to a pattern of exposed parts of a photoresist layer over a semiconductor wafer.

The absorption layer 24 is composed of a material that exhibits high absorbance to EUV light. The absorption layer 24 may be composed of tantalum, indium oxide, tellurium oxide, or tin telluride, for example.

The pellicle 1 is attached to the photomask 2. The pellicle 1 prevents adhesion of dust or the like to a reflective surface of the photomask 2. When the photomask 2 is of a transmission type, the pellicle 1 may be attached to both surfaces of the photomask 2.

The pellicle 1 includes a frame 11 and a pellicle membrane 12.

The frame 11 is attached to the photomask 2 via an adhesive or a securing mechanism (not shown). The frame 11 serves as a spacer that separates the pellicle membrane 12 from the photomask 2. The frame 11 may be composed of aluminum, for example.

The pellicle membrane 12 has high transmittance to exposure light, which is EUV light here. The pellicle membrane 12 is supported by the frame 11 disposed between the pellicle membrane 12 and the photomask 2. Specifically, a peripheral portion of the pellicle membrane 12 is secured to the frame 11, for example, using an adhesive.

The pellicle membrane 12 is a self-supporting film. The term "self-supporting film" as used herein refers to a film that can be handled alone without any other component supporting it. The pellicle membrane 12 includes a plurality of laminated layers. One or more, preferably two or more of these layers have at least one hole.

Figure 2:
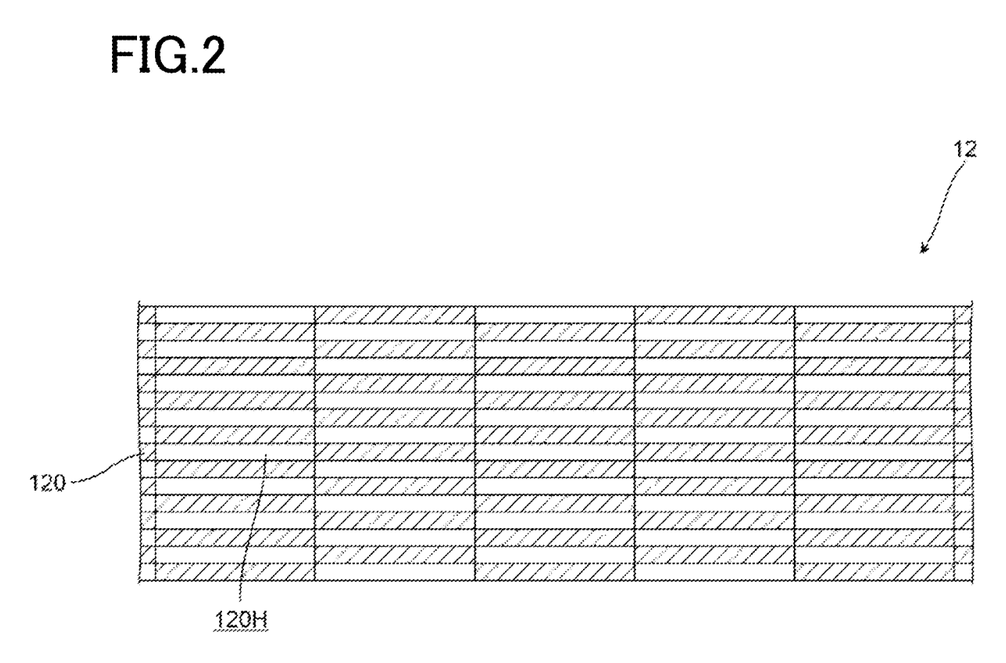
FIG. 2 is a schematic cross-sectional view of an example of a pellicle membrane that can be used for the pellicle of FIG. 1.
Figure 3:
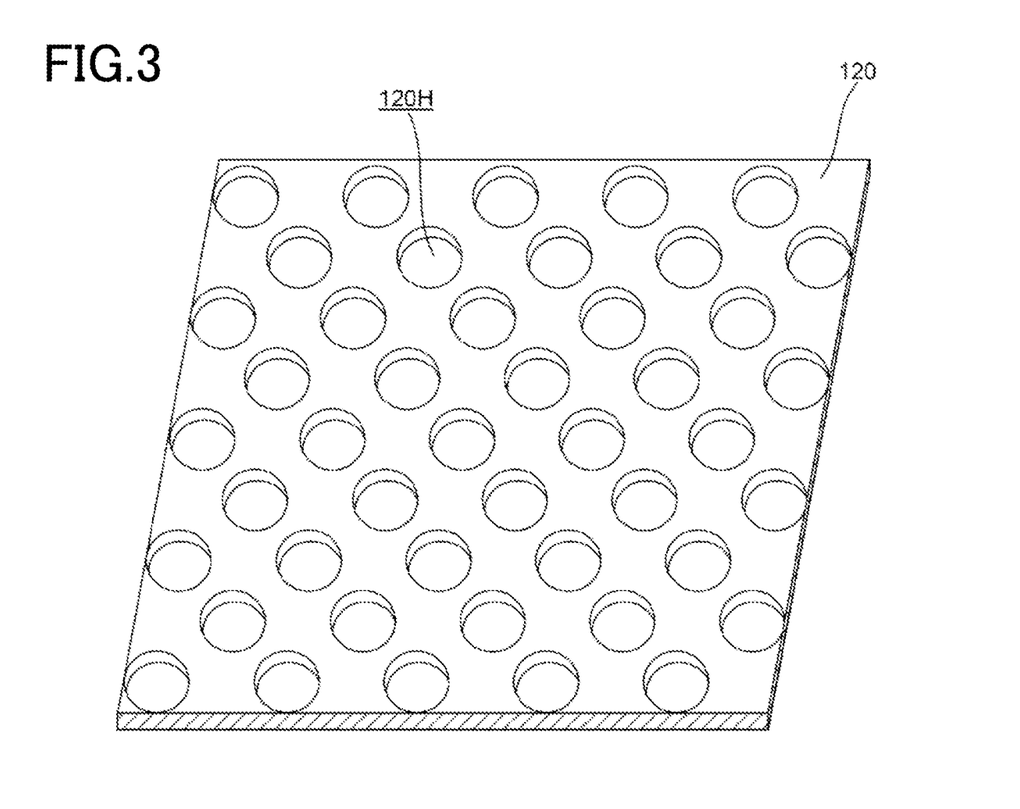
FIG. 3 is a schematic perspective view of an example of a structure that can be adopted for layers constituting the pellicle membrane of FIG. 2.

FIG. 2 is a schematic cross-sectional view of an example of a pellicle membrane that can be used for the pellicle of FIG. 1. FIG. 3 is a schematic perspective view of an example of a structure that can be adopted for layers constituting the pellicle membrane of FIG. 2.

The pellicle membrane 12 of FIG. 2 includes a plurality of laminated layers 120. Major surfaces of these layers 120 are substantially parallel to a major surface of the pellicle membrane 12.

As illustrated in FIGS. 2 and 3, each of the layers 120 has a plurality of holes 120H. Here, as illustrated in FIG. 3, these holes 120H have the same shape and dimensions as each other. Specifically, each hole 120H is a through hole having a circular opening. These holes 120H are regularly arranged in two directions intersecting each other.

The width or diameter of each hole 120H is preferably 500 nm or less, more preferably 300 nm or less, even more preferably 200 nm or less. As each hole 120H has a greater width or diameter, dust or the like is more likely to pass through the pellicle membrane 12.

The width or diameter of each hole 120H is preferably 10 nm or more, more preferably 20 nm or more, even more preferably 30 nm or more. The smaller the width or diameter of each hole 120H, the more difficult it is to produce the layer 120.

The porosity or aperture ratio of each layer 120 having the holes 120H is preferably within a range of 5 to 75%, more preferably 10 to 50%, even more preferably 10 to 25%. The lower the porosity or aperture ratio of each layer 120, the lower the transmittance of the pellicle membrane 12. The individual layers 120 have decreased strength when designed to have higher porosity or aperture ratio; thus, the higher the porosity or aperture ratio of each layer 120, the more difficult it is to produce the pellicle membrane 12.

As illustrated in FIG. 2, adjacent ones of the layers 120 are different from each other in position of holes 120H. With this configuration, there is a low probability that dust or the like will pass through the pellicle membrane 12.

The layers 120 are each composed of a material selected from, for example, graphene, carbon nanotube, polysilicon, and silicon nitride. Each of the layers 120 is preferably composed of a material selected from graphene and carbon nanotube.

The term "graphene sheet" as used herein refers to a monomolecular layer of graphene, or a laminate of such layers laminated in a thickness direction thereof. Graphene is a molecule that is composed of carbon atoms arranged with a distance of about 0.142 nm therebetween and that has a thickness of about 0.335 nm. A graphene sheet exhibits higher absorbance for all wavelengths in the range between the ultraviolet range and the infrared range than for the wavelengths in the range of EUV light. Specifically, a graphene sheet exhibits an absorbance of about 2.3% for wavelengths in the visible spectrum, in contrast to about 0.2% for the wavelengths of EUV light.

Each of the layers 120 may be composed of one or more materials that include one or more metal elements. For example, each of the layers 120 may be composed of one or more materials that include one or more metal elements selected from zirconium, niobium, molybdenum, tantalum, hafnium, scandium, titanium, vanadium, and chromium. In this case, each of the layers 120 is preferably composed of one or more materials that include one or more metal elements selected from zirconium, niobium, molybdenum, tantalum, hafnium, scandium, and titanium, and more preferably, is composed of one or more materials that consist essentially of one or more metal elements selected from zirconium, niobium, molybdenum, tantalum, hafnium, scandium, and titanium. Zirconium, niobium, molybdenum, tantalum, hafnium, scandium, and titanium have a lower mass absorption coefficient than carbon.

In addition to the above metal elements, each of the layers 120 may further include at least one of carbon and nitrogen. In this case, the one or more metal elements and at least one of carbon and nitrogen may form a two-dimensional inorganic compound. This two-dimensional inorganic compound may be, for example, a flake-like compound several atoms thick, that is composed of a metal carbide, a metal nitride, or a metal carbonitride. In a layer composed of such a flake-like compound, many flakes are located so as to have their thickness in substantially the same direction as the thickness direction of the layer. Therefore, when the plurality of layers 120 are each composed of such a flake-like compound, each layer 120 is composed of one or more flakes.

Here, each of the layers 120 is composed of a graphene sheet, for example.

The thickness of the pellicle membrane 12 is preferably 200 nm or less, more preferably 100 nm or less, even more preferably 70 nm or less. The greater the thickness of the pellicle membrane 12, the lower the transmittance of the pellicle membrane 12 to exposure light, which is EUV light here. The thickness of the pellicle membrane 12 is preferably 10 nm or more, more preferably 20 nm or more. Reducing the thickness of the pellicle membrane 12 lowers its mechanical strength and increases a probability that dust or the like passes through the pellicle membrane 12.

The pellicle membrane 12 preferably exhibits a transmittance of 90% or more at a wavelength of exposure light. When the exposure light is EUV light, for example, the pellicle membrane 12 preferably exhibits a transmittance of about 90% or more at a wavelength of EUV light.

The pellicle membrane 12 is preferably designed to prevent dust or the like having a diameter of 30 nm or more from passing therethrough. More specifically, the width or diameter of each hole 120H and position thereof in the pellicle membrane 12 are preferably set so that dust or the like having a diameter of 30 nm or more does not pass therethrough.

The pellicle membrane 12 described above may be produced, for example, using the method below. Here, as mentioned above, each of the layers 120 is composed of a graphene sheet.

Figure 4:
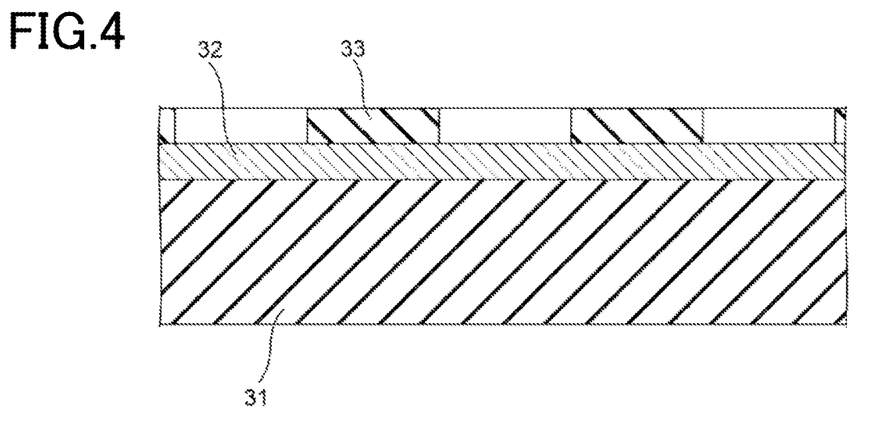
FIG. 4 is a schematic cross-sectional view illustrating a step performed in an example of a method for producing a graphene sheet.
Figure 5:
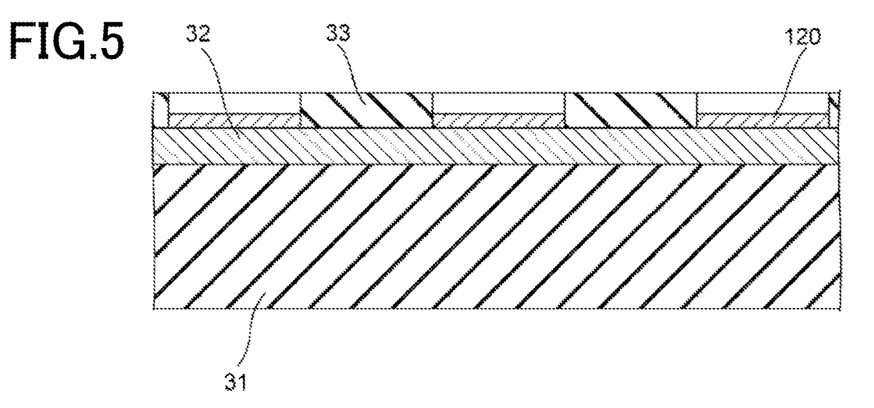
FIG. 5 is a schematic cross-sectional view illustrating a step performed following the step of FIG. 4.

FIG. 4 is a schematic cross-sectional view illustrating a step performed in an example of a method for producing a graphene sheet. FIG. 5 is a schematic cross-sectional view illustrating a step performed following the step of FIG. 4.

FIG. 4 is a schematic cross-sectional view illustrating a step performed in an example of a method for producing a graphene sheet. FIG. 5 is a schematic cross-sectional view illustrating another step performed in the production method of FIG. 4.

For production of the pellicle membrane 12 described above, first, the structure illustrated in FIG. 4 is prepared, for example.

The structure illustrated in FIG. 4 includes a substrate 31, a metal layer 32, and mask layers 33.

The substrate 31 has a smooth surface. The substrate 31 is a non-metal substrate, such as a silicon substrate, glass substrate, or sapphire substrate.

The metal layer 32 is disposed on the surface of the substrate 31. The metal layer 32 is composed of metal, such as copper or nickel.

The substrate 31 and the metal layer 32 may have a foundation layer interposed therebetween. The foundation layer is composed of aluminum nitride, aluminum oxide, or silicon oxide, for example. When the metal layer 32 has a sufficient thickness, the substrate 31 may be omitted.

The mask layers 33 cover parts of the surface of the metal layer 32. Specifically, the mask layers 33 cover the surface of the metal layer 32 only at positions corresponding to the holes 120H of the layer 120.

The mask layer 33 may be made of a non-metal material. Examples of the non-metal material include an organic polymer material and an inorganic insulating material. A mask layer 33 composed of an organic polymer material can be obtained, for example, by forming a photoresist layer on the metal layer 32, subjecting the photoresist layer to pattern exposure using ultraviolet light or to electron-beam lithography, followed by development. A mask layer 33 composed of an inorganic insulating material can be obtained, for example, by forming an inorganic insulating layer and a photoresist layer in this order on the metal layer 32, subjecting the photoresist layer to pattern exposure using ultraviolet light or to electron-beam lithography, followed by development to form an etch mask, and then etching the inorganic insulating layer.

Graphene is then produced on the exposed portions of the metal layer 32 by chemical vapor deposition (CVD), such as thermal CVD or plasma-enhanced CVD. As source gases for CVD, for example, a gas mixture containing methane and hydrogen may be used. Thus, as illustrated in FIG. 5, a graphene sheet having openings at positions corresponding to the mask layers 33 is obtained as the layer 120. When, for example, the metal layer 32 is composed of nickel, this method may involve forming such a graphene sheet on both sides of the metal layer 32.

The above process for producing the structure illustrated in FIG. 5 is performed repeatedly. Subsequently, a transfer operation of transferring one graphene sheet onto another graphene sheet is performed repeatedly.

For example, first, a binder layer composed of an organic polymer material is formed on one graphene sheet. Examples of the organic polymer material include siloxane compounds, acrylic compounds, and epoxy compounds. The mask layers 33 and metal layer 32 are then removed by etching. Thus, the graphene sheet is transferred from the metal layer 32 to the binder layer. The mask layers 33 may be removed before formation of the binder layer composed of an organic polymer material. Next, the graphene sheet on the binder layer is pressure-bonded to another graphene sheet. Graphene sheets remain bonded to each other due to Van der Waals force. The binder layer was then removed from the graphene sheet by etching. Thus, a double layer structure including two laminated graphene sheets is obtained. A multilayer structure including three or more laminated graphene sheets can be obtained by repeatedly performing the above operations. Subsequently, the mask layers 33 and metal layer 32 in contact with this double layer structure or multilayer structure are removed by etching. Consequently, a pellicle membrane 12 with its layers 120 each composed of a graphene sheet is obtained.

The pellicle membrane 12 may be produced using another method.

Figure 6:
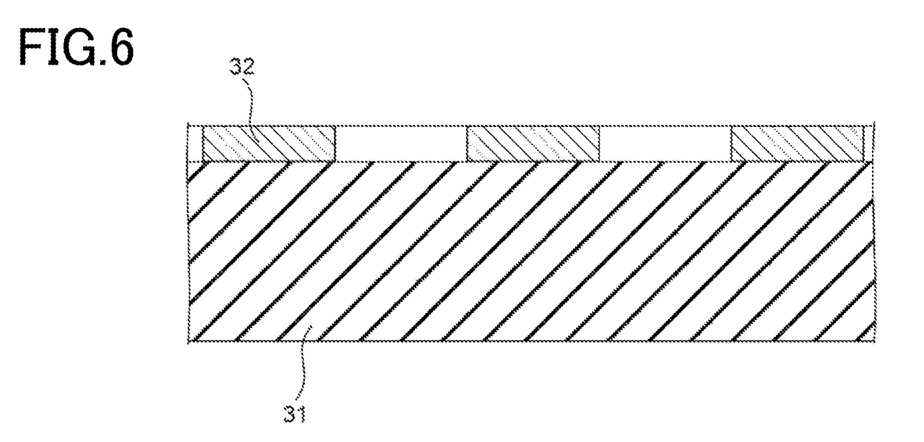
FIG. 6 is a schematic cross-sectional view illustrating a step performed in another example of a method for producing a graphene sheet.
Figure 7:
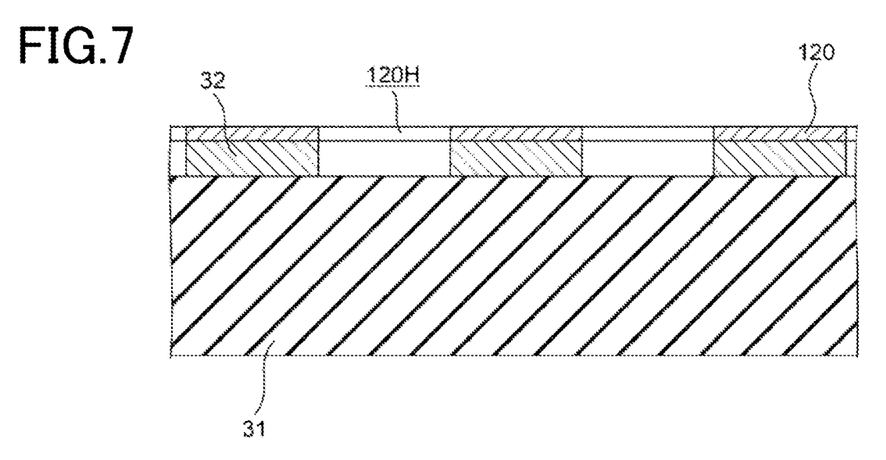
FIG. 7 is a schematic cross-sectional view illustrating a step performed following the step of FIG. 6.

FIG. 6 is a schematic cross-sectional view illustrating a step performed in another example of a method for producing a graphene sheet. FIG. 7 is a schematic cross-sectional view illustrating a step performed following the step of FIG. 6.

The method illustrated in FIGS. 6 and 7 differs from the method described with reference to FIGS. 4 and 5 in the following point. That is, the method illustrated in FIGS. 6 and 7 involves forming, as the metal layer 32, a pattern layer having openings at positions corresponding to the holes 120H, with the mask layers 33 omitted. For example, first, the structure illustrated in FIG. 4 is formed, and the metal layer 32 is etched using the mask layers 33 as etch masks. The mask layers 33 are then removed, for example, by etching. Graphene is then produced on the metal layers 32 using the method described with reference to FIG. 5. Subsequently, the transfer operation and the like described with reference to FIGS. 4 and 5 are performed to obtain a pellicle membrane 12 with its layers 120 each composed of a graphene sheet.

The pellicle membrane 12 may be produced using still another method.

For example, graphene continuous-membrane sheets may be produced, and these sheets subjected to punching or laser beam irradiation to form holes therein. For laser beam irradiation, for example, an ultrashort pulse laser, such as a picosecond laser or a nanosecond laser may be used. Other than producing graphene sheets in this way, the same method as above is used to obtain a pellicle membrane 12 with its layers 120 each composed of a graphene sheet.

As described above, the pellicle membrane 12 includes one or more holes 120H in at least one of the layers 120. Accordingly, the pellicle membrane 12 has an apparent density less than its true density. Thus, the pellicle membrane 12 has higher transmittance than a laminate having a thickness equal to that of the membrane and comprised of graphene continuous-membrane sheets.

The pellicle membrane 12 is thicker than a membrane produced by laminating layers that are identical to the layers 120 except that one or more holes 120H are not disposed, and that are equal in mass per unit area to each other. Accordingly, the pellicle membrane 12 is less deformed by a force exerted thereon in a thickness direction thereof.

The pellicle membrane 12 is thus better resistant to breakage when subjected to a force exerted thereon in a thickness direction thereof, while having high transmittance to light.

In the pellicle membrane 12, the positions, dimensions, and the like of the holes 120H are defined by design. Accordingly, it is possible to, for example, regularly arrange the holes 120H or make dimensions of the holes 120H uniform. Thus, the above configuration is suitable for obtaining a pellicle membrane 12 having optical properties and mechanical strength which are excellent in terms of in-plane uniformity.

Further, since the pellicle membrane 12 has a structure in which layers 120 are laminated, optical properties and mechanical strength thereof vary depending on the number of laminated layers 120. Thus, for the above structure, it is possible to adjust optical properties and mechanical strength of the pellicle membrane 12 according to the number of laminated layers 120.

The pellicle membrane 12 preferably has a ratio D1/D2 of an apparent density D1 to a true density D2 within a range of 5 to 75, more preferably 10 to 50, and still more preferably 10 to 25. Reducing the ratio D1/D2 lowers the mechanical strength of each layer 120, thus making it difficult to produce pellicle membranes 12. Increasing the ratio D1/D2 makes the pellicle membrane 12 resistant to breakage when subjected to a force exerted thereon in a thickness direction thereof, but an increased ratio D1/D2 makes it difficult for the pellicle membrane 12 to have high transmittance to light.

The apparent density D1 of the pellicle membrane 12 is a value obtained by dividing the mass per unit area of the pellicle membrane 12 by the thickness of the pellicle membrane 12. The thickness of the pellicle membrane 12 is obtained, for example, by capturing scanning electron microscope images of cross sections of the pellicle membrane 12 at 10 places with a distance of 1 mm or more therebetween, measuring the thickness thereof from each of the images, and determining the arithmetic mean of values of the thicknesses. The true density D2 of the pellicle membrane 12 is a true density of a material having a composition identified by analyzing the pellicle membrane 12. When, for example, the pellicle membrane 12 is composed of graphene sheets, the true density thereof is a density of graphite having no pores.

As described above, this pellicle membrane 12 has higher transmittance than a laminate having a thickness equal to that of the membrane and comprised of graphene continuous-membrane sheets. That is, this pellicle membrane 12 is lower in linear absorption coefficient $\mu$ in a thickness direction than a laminate having a thickness equal to that of the membrane and comprised of graphene continuous-membrane sheets.

The linear absorption coefficient $\mu$ is a value calculated from the following equation:

$$I/IO = e^{-\mu x}$$

In the above equation, IO represents the intensity of incident light, I represents the intensity of transmitted light, e represents the base of the natural logarithm (Napier's constant), and x represents the length of an optical path.

The pellicle membrane 12 having one or more holes 120H in its layers 120 has a lower apparent density than graphite having no pores. Therefore, this pellicle membrane 12 is lower in linear absorption coefficient $\mu$ in a thickness direction than a laminate comprised of graphene continuous-membrane sheets that correspond in number to the layers 120. Thus, this pellicle membrane 12 has high transmittance to light.

Various modifications may be made to the pellicle membrane 12.

Figure 8:
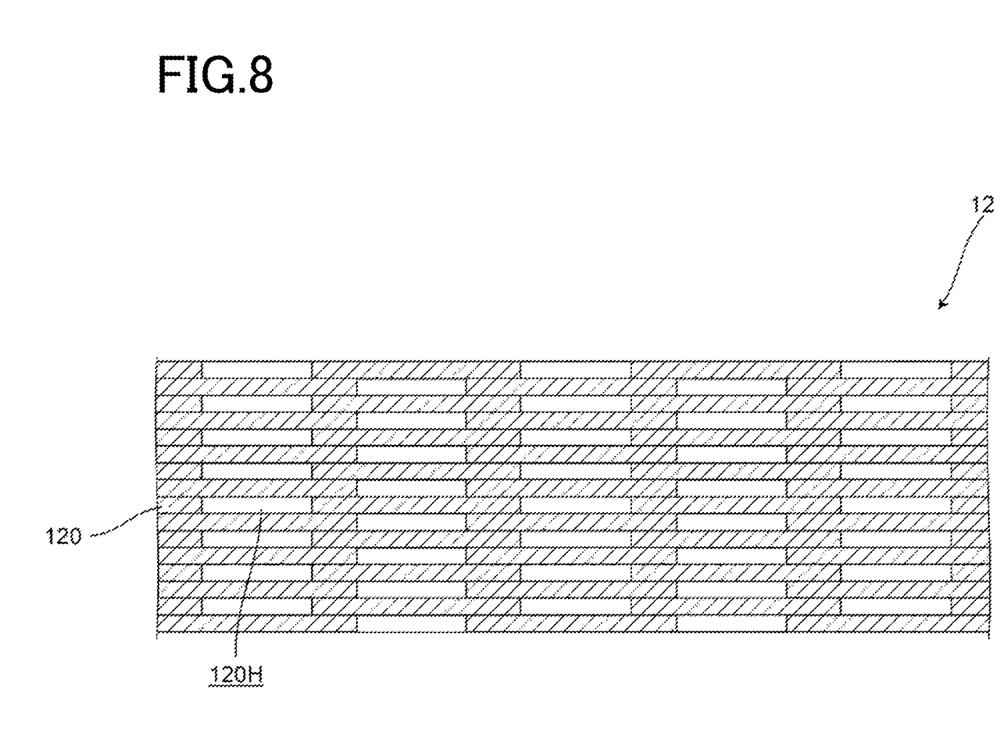
FIG. 8 is a schematic cross-sectional view of another example of a pellicle membrane that can be used for the pellicle of FIG. 1.

FIG. 8 is a schematic cross-sectional view of another example of a pellicle membrane that can be used for the pellicle of FIG. 1. The pellicle membrane 12 illustrated in FIG. 8 is the same as the pellicle membrane 12 described with reference to FIGS. 1 to 3 and the like, except that the width or diameter of the holes 120H is smaller.

The smaller the width or diameter of holes 120H, the lower the probability that holes 120H of adjacent layers 120 are connected to each other. Accordingly, with the width or diameter of holes 120H reduced, there is a lower probability that the pellicle membrane 12 has a through hole. Thus, adopting this configuration further reduces a probability that dust or the like passes through the pellicle membrane 12.

Figure 9:
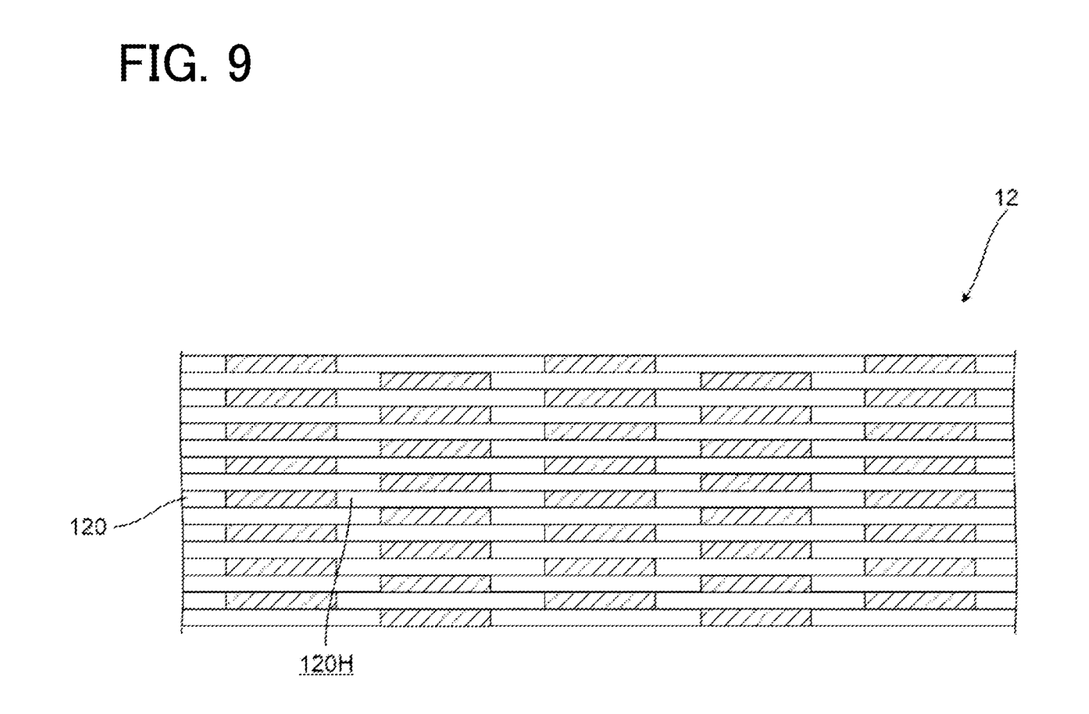
FIG. 9 is a schematic cross-sectional view of still another example of a pellicle membrane that can be used for the pellicle of FIG. 1.

FIG. 9 is a schematic cross-sectional view of still another example of a pellicle membrane that can be used for the pellicle of FIG. 1. The pellicle membrane 12 illustrated in FIG. 9 is the same as the pellicle membrane 12 described with reference to FIGS. 1 to 3 and the like, except that the width or diameter of the holes 120H is larger.

The greater the width or diameter of holes 120H, the higher the probability that holes 120H of adjacent layers 120 are connected to each other. However, with a large number of such layers 120 laminated, there is a sufficiently low probability that dust or the like passes through the pellicle membrane 12.

Figure 10:
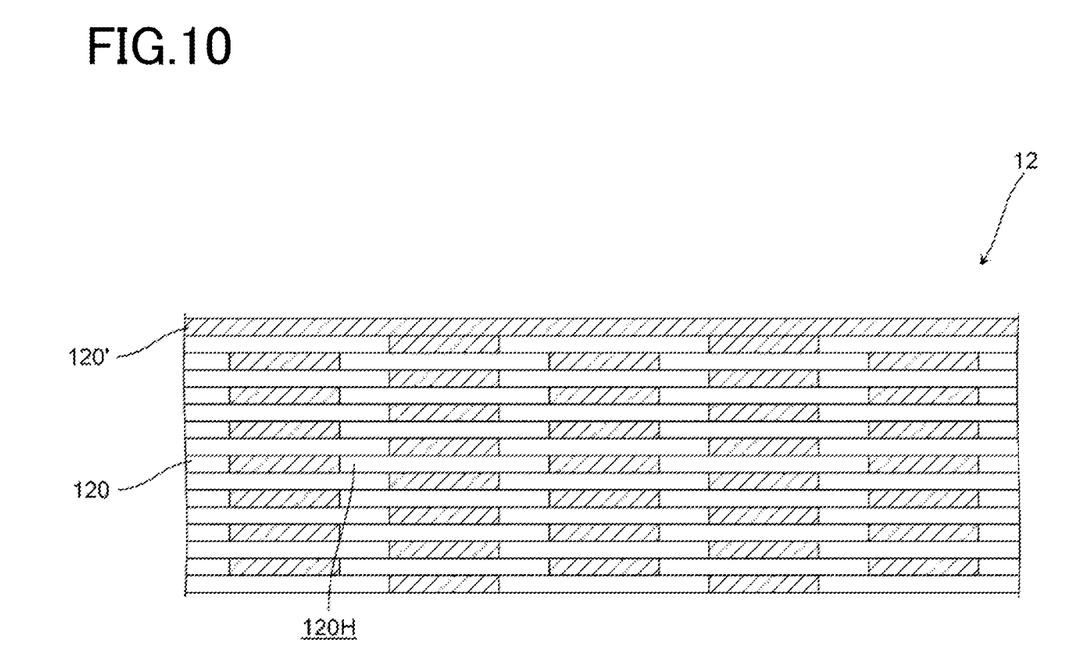
FIG. 10 is a schematic cross-sectional view of still another example of a pellicle membrane that can be used for the pellicle of FIG. 1.

FIG. 10 is a schematic cross-sectional view of still another example of a pellicle membrane that can be used for the pellicle of FIG. 1. The pellicle membrane 12 illustrated in FIG. 10 differs from the pellicle membrane 12 described with reference to FIG. 9 in that a layer 120' identical to the layer 120 except that holes 120H are not provided is disposed as an outermost layer of the pellicle membrane 12 on at least one side thereof.

Dust or the like does not pass through the layer 120' having no holes 120H. Therefore, dust or the like does not pass through the pellicle membrane 12 including this layer 120'.

The pellicle membrane 12 illustrated in FIG. 10 is preferably supported by the frame 11 such that the layer 120' faces outward. Since the layer 120' has no holes, adopting the above arrangement facilitates removal of dust or the like, for example, by blowing air to the layer 120'.

The pellicle membrane 12 may include the layer 120' between adjacent layers 120. Further, the pellicle membrane 12 may include two or more layers 120'. In either case, the pellicle membrane 12 can prevent dust or the like from passing therethrough.

In the above description, the holes 120H are circular, but the shape of the holes 120H is not limited to circular.

Figure 11:
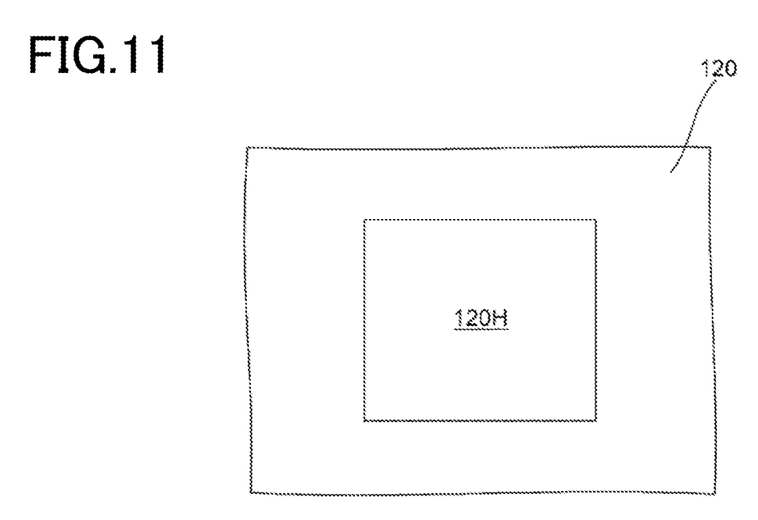
FIG. 11 is a schematic plan view illustrating an example of a configuration that can be adopted for a hole.
Figure 12:
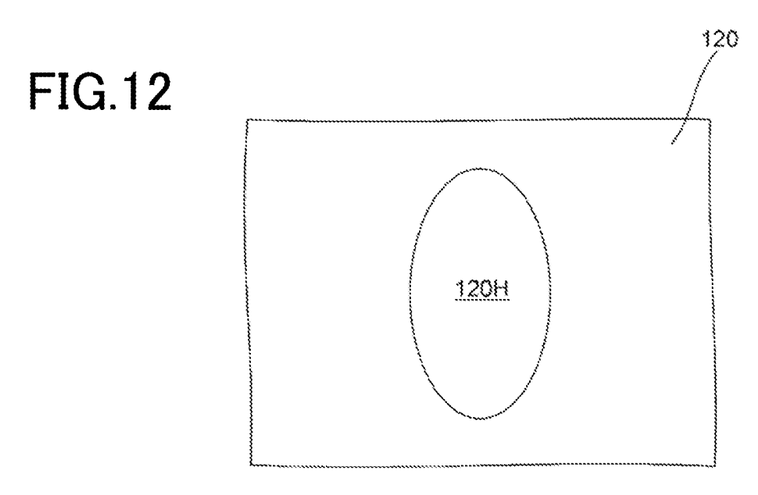
FIG. 12 is a schematic plan view illustrating another example of a configuration that can be adopted for a hole.
Figure 13:
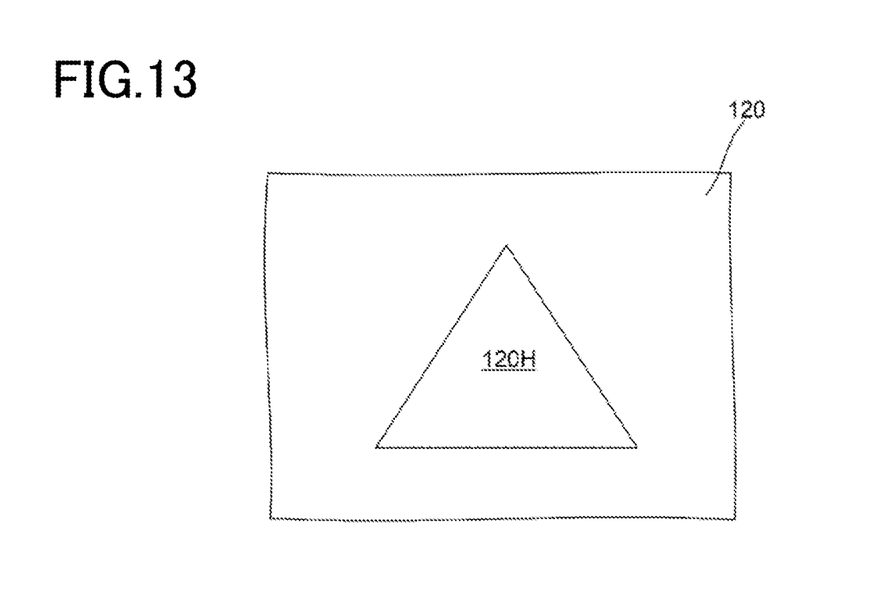
FIG. 13 is a schematic plan view illustrating still another example of a configuration that can be adopted for a hole.
Figure 14:
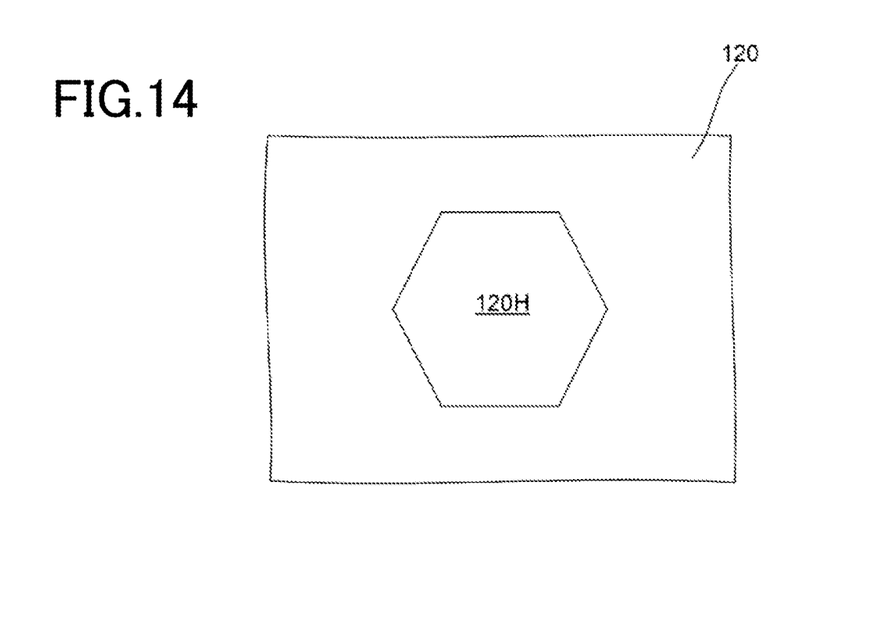
FIG. 14 is a schematic plan view illustrating still another example of a configuration that can be adopted for a hole.
Figure 15:
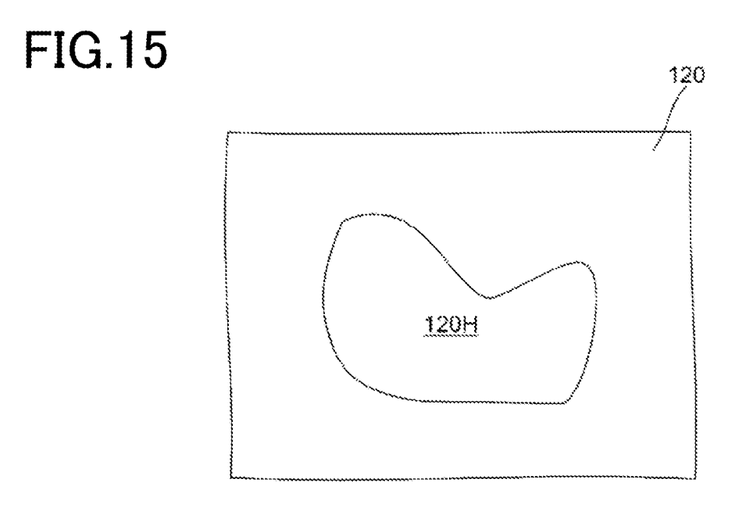
FIG. 15 is a schematic plan view illustrating still another example of a configuration that can be adopted for a hole.

FIG. 11 is a schematic plan view illustrating an example of a configuration that can be adopted for a hole. FIG. 12 is a schematic plan view illustrating another example of a configuration that can be adopted for a hole. FIG. 13 is a schematic plan view illustrating still another example of a configuration that can be adopted for a hole. FIG. 14 is a schematic plan view illustrating still another example of a configuration that can be adopted for a hole. FIG. 15 is a schematic plan view illustrating still another example of a configuration that can be adopted for a hole.

In the configuration illustrated in FIG. 11, the hole 120H has a quadrilateral shape. In the configuration illustrated in FIG. 12, the hole 120H has an elliptical shape. In the configuration illustrated in FIG. 13, the hole 120H has a triangular shape. In the configuration illustrated in FIG. 14, the hole 120H has a hexagonal shape. In the configuration illustrated in FIG. 15, the hole 120H has an irregular shape. Thus, the hole 120H may have various shapes.

In each of the layers 120, the holes 120H may be identical to each other in either or both of shape and dimension. When the holes 120H of each layer 120 are designed to be identical to each other in shape and dimension, desired physical properties can be easily obtained.

The holes 120H of at least one layer 120 and the holes 120H of at least one other layer 120 may be identical to each other in either or both of shape and dimension.

In each of the layers 120, the holes 120H may be irregularly arranged, but it is preferred that they are regularly arranged. In the latter case, desired physical properties can be easily obtained.

The holes 120H of at least one layer 120 and the holes 120H of at least one other layer 120 may be identical to or different from each other in number.

The layer 120 may have only one hole 120H. For example, the layer 120 may have only one hole 120H formed in a pattern that can be drawn with a single stroke, such as a spiral line.

The layer 120 and the layer 120' may be formed of a material other than graphene. For example, the material of the layer 120 and the layer 120' may be selected from carbon nanotube, polysilicon, and silicon nitride.

For example, a pellicle membrane 12 composed of silicon layers 120 may be obtained by forming a plurality of silicon layers having holes 120H by a general semiconductor process, and laminating the silicon layers with each other.

A pellicle membrane 12 composed of carbon nanotube layers 120 may be produced using the following method. First, an aqueous dispersion is prepared by dispersing carbon nanotube in a dispersion medium. This aqueous dispersion is applied onto a substrate, followed by removal of the dispersion medium from the coating film, to obtain a sheet composed of carbon nanotube. This sheet is subjected to, for example, laser beam irradiation, to obtain a layer 120 having openings 120H. The above process is repeatedly performed to form a plurality of layers 120, followed by lamination of these layers, to obtain a pellicle membrane 12 composed of carbon nanotube layers 120.

At least one layer 120 and at least one other layer 120 may be formed of the same material or different materials. In the latter case, for example, at least one layer 120 may be composed of a graphene sheet, and at least one other layer 120 may be composed of a carbon nanotube layer. Similarly, the layer 120 and the layer 120' may be formed of the same material or different materials.

When the layer 120' is disposed as an outermost layer of the pellicle membrane 12, the layer 120' is a covering layer that covers a laminate of layers 120. The covering layer may be disposed on either or both of major surfaces of the laminate of layers 120.

The covering layer may be formed of any one of the materials mentioned above for the layer 120 or other material. The covering layer may be composed of, for example, metal or semiconductor. In one example, the covering layer includes at least one element selected from silicon, molybdenum, ruthenium, boron, nitrogen, germanium, and hafnium. In another example, the covering layer includes boron, boron carbide, zirconium nitride, molybdenum, ruthenium, silicon carbide, titanium nitride, amorphous carbon, or graphene, or a combination of two or more thereof.

The above configuration for the pellicle membrane 12 may be applied to a film used for other purposes. Films adopting the above configuration are better resistant to breakage when subjected to force exerted thereon in the thickness direction thereof and have optical transparency and adsorption performance which are excellent in terms of in-plane uniformity.

[Reference Signs List] 1 . . . Pellicle; 2 . . . Photomask; 11 . . . Frame; 12 . . . Pellicle membrane; 21 . . . Substrate; 22 . . . Multilayered reflective film; 22a . . . Reflective layer; 22b . . . Reflective layer; 23 . . . Capping film; 24 . . . Absorption layer; 31 . . . Substrate; 32 . . . Metal layer; 33 . . . Mask layer; 120 . . . Layer; 120' . . . Layer; 120H . . . Hole.

What is claimed is:

1. A pellicle membrane, comprising:
a plurality of laminated layers, each laminated layer of the plurality of laminated layers has a plurality of identical holes, each
having a width or diameter of 10 nm to 500 nm, wherein the holes of the plurality of laminated layers do not form a through hole extending through each layer of the plurality of the laminated layers.

2. The pellicle membrane of claim 1, wherein each of the plurality of laminated layers comprises a material selected from the group consisting of graphene, carbon nanotube, polysilicon, and silicon nitride.

3. The pellicle membrane of claim 1, wherein each of the plurality of laminated layers comprises one or more materials that include one or more metal elements selected from the group consisting of zirconium, niobium, molybdenum, tantalum, hafnium, scandium, titanium, vanadium, and chromium.

4. The pellicle membrane of claim 1, wherein the width or diameter of 300 nm or less.

5. The pellicle membrane of claim 1, further comprising a hole-free layer provided with no holes, the hole-free layer is laminated to the plurality of laminated layers.

6. The pellicle membrane of claim 5, wherein:
the hole-free layer is an outermost layer of the pellicle membrane.

7. The pellicle membrane of claim 1, wherein each the plurality of laminated layers is a graphene sheet.

8. The pellicle membrane of claim 1, wherein the pellicle membrane has a thickness of 200 nm or less.

9. A pellicle, comprising:
the pellicle membrane of claim 1; and
a frame supporting the pellicle membrane.

10. A pellicle membrane, comprising:
a plurality of laminated layers, each laminated layer of the plurality of laminated layers has a plurality of identical holes, wherein the holes of the plurality of laminated layers do not form a through hole extending through each layer of the plurality of the laminated layers.

11. A pellicle membrane, comprising:
a plurality of laminated layers, each laminated layer of the plurality of laminated layers has a plurality of identical holes, wherein the holes of the plurality of laminated layers do not form a through hole extending through each layer of the plurality of the laminated layers,
wherein:
each laminated layer of said plurality comprises a material selected from the group consisting of graphene and carbon nanotube.

* * * * *